United States Patent
Rahman et al.

(10) Patent No.: US 6,859,066 B1
(45) Date of Patent: Feb. 22, 2005

(54) BANK-BASED INPUT/OUTPUT BUFFERS WITH MULTIPLE REFERENCE VOLTAGES

(75) Inventors: Arifur Rahman, Yonkers, NY (US); William Andrews, Emmaus, PA (US); Mou C. Lin, High Bridge, NJ (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 63 days.

(21) Appl. No.: 10/377,320

(22) Filed: Feb. 28, 2003

(51) Int. Cl.[7] .......................................... H03K 19/094
(52) U.S. Cl. .......................................... 326/63; 326/41
(58) Field of Search .............................. 326/63, 80–81, 326/37–39, 41, 47; 327/547; 307/29, 38, 80

(56) References Cited

U.S. PATENT DOCUMENTS

| | | | | |
|---|---|---|---|---|
| 5,877,632 A | * | 3/1999 | Goetting et al. | 326/50 |
| 6,078,201 A | * | 6/2000 | Crotty | 327/143 |
| 6,377,069 B1 | * | 4/2002 | Veenstra et al. | 326/38 |
| 6,429,680 B1 | * | 8/2002 | Jeffery et al. | 326/38 |

* cited by examiner

*Primary Examiner*—James H. Cho
(74) *Attorney, Agent, or Firm*—MacPherson Kwok & Heid LLP; Jon W. Hallman

(57) ABSTRACT

A bank of input/output buffers are configured such that each input buffer in the bank may select from a plurality of voltage references during single-ended operation. Similarly, the pad associated with each input buffer may serve to supply one of the voltage references for other input buffers within the bank.

16 Claims, 3 Drawing Sheets

BANK-BASED INPUT/OUTPUT BUFFERS WITH MULTIPLE REFERENCE VOLTAGES

TECHNICAL FIELD

This invention relates to electronic circuits and, more particularly to interface circuits for programmable logic devices.

BACKGROUND

Input/output (I/O) circuits are commonly used for transferring data to and from an integrated circuit or other type of electronic device. For example, a programmable logic device such as a field programmable gate array (FPGA) or a complex programmable logic device (CPLD) will have a plurality of I/O circuits, where each I/O circuit corresponds to a pin of the FPGA. These I/O circuits (also referred to as input/output buffers, receiver/transmitter circuits, or receiver/driver circuits) typically support a variety of I/O interface standards (e.g., low voltage differential signaling (LVDS), high-speed transceiver logic (HSTL), or LVCMOS). These I/O interface standards generally address chip-to-chip interfaces, board-to-board interfaces, and box-to-box interfaces for a wide range of existing and emerging applications, such as data packet processing, data bus bridges, and high-speed memory interfacing.

Depending upon the I/O standard used in a given I/O buffer, the required supply voltage (VCC level) will vary. For example, typical supply voltages are 2.5 volt, 1.8 volt, 1.5 volt, and 1.2 volt. To permit FPGAs to operate using signals from multiple I/O standards requiring differing supply voltages, the I/O buffers are typically organized into banks. Each bank includes a plurality of I/O buffers and their corresponding pins and is configured to operate on a supply voltage supplied by a selected power supply. In this fashion, different banks of I/O buffers may operate using different supply voltages.

In the bank-based approach to organizing I/O buffers for FPGAs, the input buffer within each I/O buffer may be programmable for reference receiver operation. In reference receiver operation, the input buffer compares a received voltage to a reference voltage to make a bit decision. A voltage rail carrying the reference voltage spa the I/O buffers in each bank so that each I/O buffer may access the reference voltage during reference receiver operation. Certain I/O buffers within each bank are specialized to receive the reference voltage and couple it to the corresponding voltage rail. FIG. 1 illustrates a conventional input buffer 80 configured for reference receiver operation. A push-pull buffer 85 either pushes a current into an input lead 82 or pulls a current from input lead 82 depending upon the logical state of the data bit 90 being driven by push-pull buffer 85. Input buffer 80 couples to input lead 82, which also couples to a terminating resistor 95 receiving a terminating voltage VTT. The terminating voltage VTT is typically one-half the value of the supply voltage VDD powering the push-pull buffer 85. Input buffer 80 forms a comparator that compares the voltage on input lead 82 to the reference voltage and drives a received signal 84 either high or low. When push-pull buffer 85 pulls a current from input lead 82, the voltage on input lead 82 will tend to be pulled below the reference voltage, causing input buffer 80 to drive the received signal 84 into the corresponding logical state. Similarly, when push-pull buffer 85 drives a current into input lead 82, the voltage on input lead 82 will tend to be driven above the reference voltage, causing input buffer 80 to drive received signal 84 into the complement logical state. Input buffer 80 would be organized within a bank of input buffers all sharing the same supply voltage VDD. A specialized input buffer within the bank supplies the reference voltage.

Although the bank-based approach to organizing I/O buffers allows an FPGA to operate with multiple I/O standards requiring differing supply voltages, the approach suffers a number of drawbacks. For example, the routing of external signals to each bank is hindered because the voltage reference can be received only at the I/O buffers that are specialized for this function. In addition, no provision is made for utilizing multiple voltage references within a single bank.

Accordingly, there is a need in the art for improved bank-based approaches to I/O buffer organization for programmable logic devices that provide users with greater routing flexibility and improved I/O buffer utilization efficiency.

SUMMARY

In accordance with one aspect of the invention, a bank of input buffers for a programmable semiconductor device are configured to select from multiple voltage references, each voltage reference being carried on its own voltage rail. Each input buffer may receive input signals from its input pad. In addition, each input pad may be selected to supply one of the multiple voltage references. A plurality of multiplexers corresponds to the plurality of input buffers, wherein each multiplexer is configurable to receive a reference voltage from its input buffer's pad and selectively couple the reference voltage to one of the voltage rails. A plurality of demultiplexers also corresponds to the plurality of input buffers, wherein each demultiplexer is configurable to select one of the voltage rails and couple the selected voltage rail to its corresponding input buffer, whereby the corresponding input buffer may receive the voltage reference carried on the selected voltage rail.

DETAILED DESCRIPTION

Figure 1:
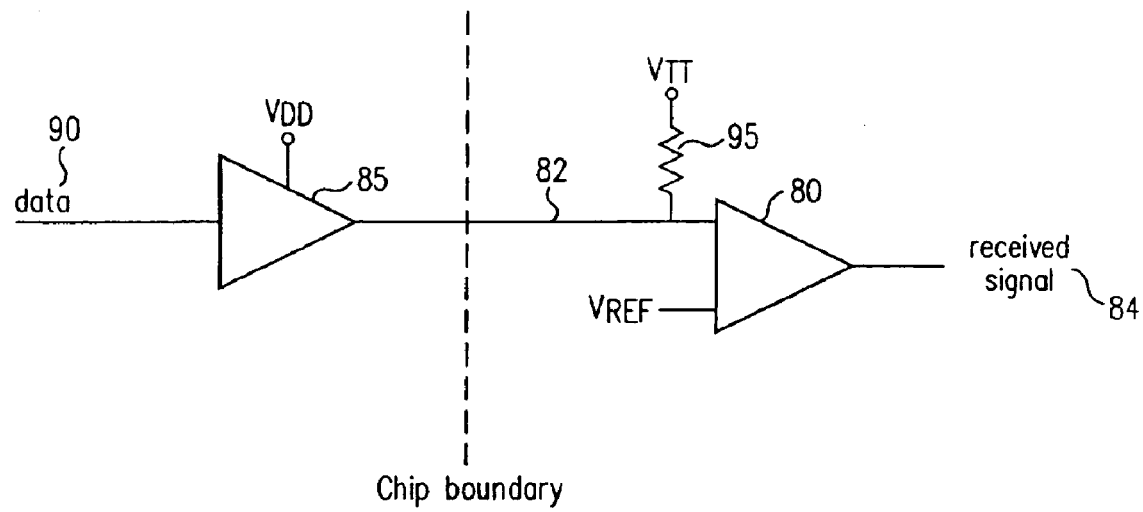
FIG. 1 illustrates a conventional input buffer configured for reference receiver operation.
Figure 2:
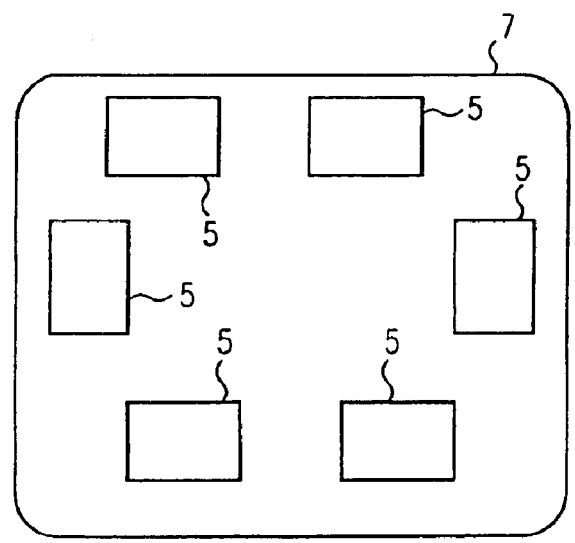
FIG. 2 is a block diagram of a programmable logic device having banks of I/O buffers.
Figure 3:
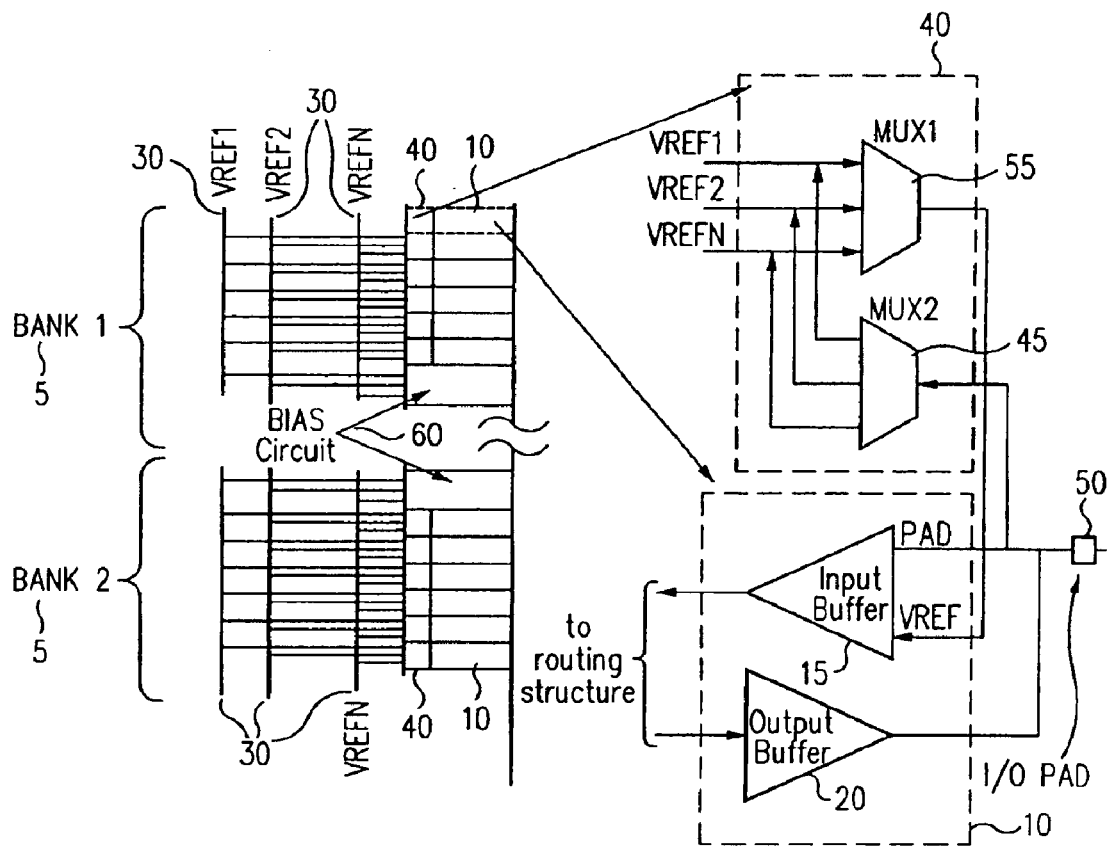
FIG. 3 is a block diagram for a bank of input buffers wherein each input buffer may select from a plurality of voltage references according to one embodiment of the invention.

FIGS. 2 and 3 illustrate banks 5 of I/O buffers 10 for a programmable logic device 7. The banks 5 may include any desired number of I/O buffers 10. Similarly, programmable logic device 7 may include any desired number of banks 5. Because the banks 5 may be assigned differing power supply voltages, programmable logic device 7 may simultaneously communicate through banks 5 using multiple I/O standards corresponding to the differing power supply voltages. Each I/O buffer 10 may include an input buffer 15 and an output buffer 20. During reference receiver operation, a given input buffer 15 may receive a voltage reference selected from a plurality of N voltage references carried on a corresponding plurality of N voltage rails 30 spanning each bank 5. Thus, a given input buffer 15 may use one of the voltage references while another input buffer 15 within the same bank 5 may use the same or a different voltage reference during reference receiver operation.

Although each input buffer 15 within a bank 5 may receive a voltage reference as described herein, each input buffer 15 may also be configured to supply one of the voltage references. In this fashion, routing of external signals to the bank 5 is very flexible in that any input buffer 15 may serve to supply a needed voltage reference.

To enable operation with multiple voltage references and flexible signal routing, each I/O buffer 10 associates with a routing circuit 40. Within routing circuit 40, a 1:N multiplexer 45, which may also be denoted as a demultiplexer 45, couples to its I/O buffer's I/O pad 50 (which may also be a pin) to receive a voltage reference for coupling to the intended voltage rail 30. As is the case for the remaining elements in each bank 5, 1:N multiplexer 45 may be configured by configuration signals coupled from a memory, such as a non-volatile memory (not illustrated). A user would program the non-volatile memory accordingly to generate the proper configuration signals to control the various elements within each bank 5 to perform as desired. Alternatively, 1:N multiplexer 45 and the remaining elements in each bank 5 may be programmed using dynamically-created signals during operation of programmable logic device 7. Regardless of how it is programmed, with respect to a given 1:N multiplexer 45, should the corresponding input pad 50 be assigned a voltage reference supply role, the given 1:N multiplexer 45 would be configured to couple the voltage reference from the corresponding input pad 50 to the proper voltage rail 30. In this case, the corresponding input buffer 15 would be disabled. The association of a demultiplexer with each I/O buffer 10 allows each input pad 50 to function as the input whereby an outside voltage reference may be coupled to one of the voltage rails 30. In an alternate embodiment, a particular input pad 50 may be dedicated to a particular voltage reference. In such an embodiment, demultiplexer 45 would be replaced by a switch such as a transmission gate for the particular input pad 50. The switch would selectively couple the given input pad 50 to a particular one of the voltage rails 30 dedicated to carrying the particular voltage reference assigned to be routed through the affected pad 50.

Should the input pad 50 corresponding to an input buffer 15 not be assigned a voltage-reference-receiving role, the input buffer 15 may be configured for reference receiver operation. In this mode, input pad 50 receives an input signal which will be processed by its input buffer 15 with respect to a voltage reference. An N:1 multiplexer 55 within routing circuit 40 is configured to select the proper voltage reference from the plurality of N voltage references carried on the N voltage rails 30. Having processed the received signal, input buffer 15 provides an output signal to downstream logic or a routing structure (not illustrated) associated with programmable logic device 7. Similarly, output buffer 20 receives signals from the routing structure before routing the received signals to its I/O pad 50.

A bias circuit 60 associates with each bank 5 to provide bias voltages for the transistors within the various bank elements as is known in the art.

Figure 5:
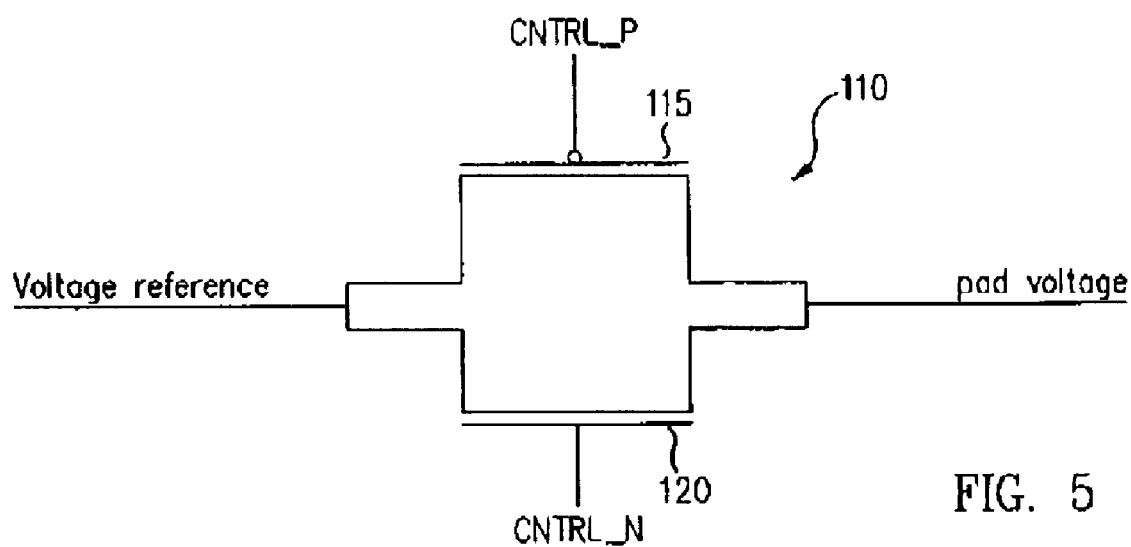
FIG. 5 illustrates a transmission gate in the 1:N multiplexer of FIG. 4.

Because each I/O pad 50 may couple to any one of the voltage rails 30 through its 1:N multiplexer 45, there is the possibility of noise being coupled from pad 50 to corrupt the N voltage references. This possibility depends upon the particular type of I/O signals being received at each pad 50 and the associated impedance mismatches. The transmission gates within a 1:N multiplexer 45 that is associated with a pad 50 not configured to receive a voltage reference would be configured to be non-conducting. For example, FIG. 5 illustrates a transmission gate 110 formed by a PFET 115 and an NFET 120. Should transmission gate 110 be configured to isolate the pad voltage from the voltage reference, the corresponding control voltages CNTRL_P and CNTRL_N would be high and low, respectively, with respect to the pad voltage. However, if the pad voltage rings or oscillates above the CNTRL_P voltage, transmission gate 110 will turn on. Similarly, if the pad voltage falls below ground, NFET 120 within transmission gate 110 will start to turn on. In either instance, noise would then be injected into the reference voltage coupled to transmission gate 110.

Figure 4:
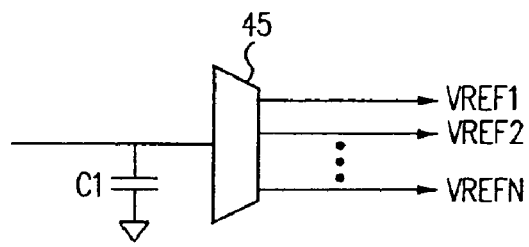
FIG. 4 illustrates a 1:N multiplexer from FIG. 3 configured to low pass filter the selected voltage reference according to one embodiment of the invention.

Given that each voltage reference is a DC signal, a low-pass filter associated with each 1:N multiplexer 45 would prevent such corruption of the N voltage references. For example, referring now to FIG. 4, the input to each 1:N multiplexer 45 may be loaded with a capacitor C1 having a capacitance of C farads and the pass transistors (not illustrated) within 1:N multiplexer 45 may have the width/length ratio of their channels adjusted such to achieve a resistance of R Ω. In this fashion, a simple one-pole low pass filter having a time constant RC is formed for each output of 1:N multiplexer 45. The values of R and C are chosen depending upon design requirements. For example, sufficient filtering is provided in an HSTL mode of operation if C equals 1 pF and the channel widths and lengths are 2 microns for fast PVT conditions (fast P and N transistor process, ten percent above VDD, −40 C).

Figure 6:
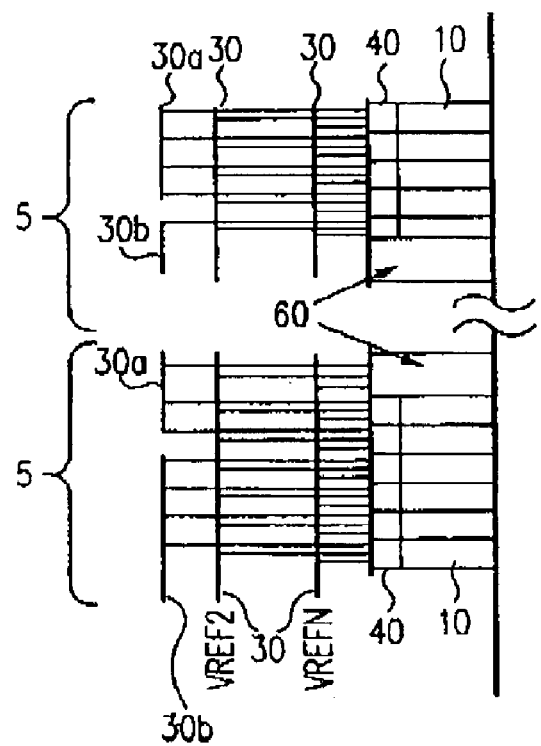
FIG. 6 is a block diagram for a bank of input buffers having a plurality of voltage references carried on a corresponding plurality of voltage rails, wherein one of the voltage rails is segmented according to one embodiment of the invention.

Although each input buffer 15 may select from the N voltage references as described above, there may be instances in which a user desires even greater flexibility in choosing a reference voltage by using voltage rails that do not span the entire bank. Turning now to FIG. 6, banks 5 are shown wherein a voltage rail is segmented into voltage rails 30a and 30b such that each rail 30a and 30b spans only a subset of the I/O buffers 10 within each bank. 5. The remaining voltage rails 30 are as discussed with respect to FIG. 3 in that they span all the input buffers 10. Each segment of voltage rail 30a and 30b spans a separate subset of I/O buffers 10. In this fashion, an input buffer 15 (see FIG. 3) within one subset of I/O buffers 10 may receive a voltage reference from voltage rail 30a while an input buffer 15 in another subset of I/O buffers 10 may receive a voltage reference from voltage rail 30b. Similarly, each pad 50 corresponding to one of the subset of I/O buffers may couple a reference voltage to its segment of voltage rail (for example, either voltage rail 30a or 30b) but not to the remaining segments. It will be appreciated, however, operation with respect to the non-segmented voltage rails 30 is as described previously.

Accordingly, although the invention has seen described with respect to particular embodiments, this description is only an example of the invention's application and should not be taken as a limitation. For example, the low pass filtering may be performed by an integrated low pass filter, a separate low pass filter. It will be appreciated that bank of I/O buffers having multiple reference voltage disclosed herein may be applied in a variety of electronic devices such as FPGAs, CPLDs, or other programmable semiconductor devices. Consequently, the scope of the invention is set forth in the following claims.

We claim:

1. Interface circuitry for a programmable semiconductor device, comprising:
   a plurality of voltage rails;
   a plurality of input buffers;
   a plurality of input pads corresponding to the plurality of input buffers, each input buffer operable to receive a single-ended signal from the corresponding input pad;
   a plurality of demultiplexers corresponding to the plurality of input buffers and to the plurality of input pads, wherein each demultiplexer is operable to receive a reference voltage from the corresponding input pad and selectively couple the reference voltage to one of the voltage rails;
   a plurality of low pass filters corresponding to the plurality of demultiplexers and to the plurality of input pads, each low pass filter being operable to inhibit noise from the corresponding input pad from coupling through the corresponding demultiplexer to the voltage rails; and
   a plurality of multiplexers corresponding to the plurality of input buffers, wherein each multiplexer is operable to select one of the voltage rails and couple the selected voltage rail to the corresponding input buffer.

2. The interface circuitry of claim 1, wherein the programmable semiconductor device is a programmable logic device.

3. The interface circuitry of claim 1, wherein each low pass filter comprises a one-pole low pass filter.

4. The interface circuitry of claim 3, wherein each one-pole low pass filter comprises a capacitor of capacitance C coupled to the corresponding demultiplexer, the corresponding demultiplexer comprising ass transistors having channels sized to achieve a resistance of R such that the one-pole low pass filter has a time constant of RC.

5. The interface circuitry of claim 1, wherein the plurality of input buffers comprises a bank of input buffers such that each input buffer in the plurality receives a same supply voltage.

6. The interface circuitry of claim 5, wherein each input pad comprises a pin of the programmable semiconductor device.

7. Interface circuitry for a programmable semiconductor device, comprising:
   a plurality of voltage rails;
   a plurality of input buffers arranged in a bank such that each input buffer in the plurality shares a same supply voltage;
   a plurality of input pads corresponding to the plurality of input buffers, each input buffer operable to receive a single-ended signal from the corresponding input pad;
   a plurality of demultiplexers corresponding to the plurality of input buffers and to the plurality of input pads, wherein each demultiplexer is operable to receive a reference voltage from the corresponding input pad and selectively couple the reference voltage to one of the voltage rails; and
   a plurality of multiplexers corresponding to the plurality of input buffers, wherein each multiplexer is operable to select one of the voltage rails and couple the selected voltage rail to the corresponding input buffer, wherein a first voltage rail in the plurality of voltage rails comprises a segmented voltage rail, each segment being electrically isolated from the remaining sections, and wherein a given segment of the first voltage rail corresponds to a given subset of pads such that should a given multiplexer corresponding to a pad in the given subset of pads be configured to select the first voltage rail, the given multiplexer may select only for the given segment.

8. The interface circuitry of claim 7, wherein the demultiplexers corresponding to the given subset of pads are each configured such that if the demultiplexer couples its pad to the first voltage rail, it may couple only to the given segment.

9. The interface circuitry of claim 7, further comprising a bias circuit configured to supply bias voltages for the bank of input buffers.

10. The interface circuitry of claim 7, wherein the bank of input buffer is configured to receive HSTL-based signals.

11. The interface circuitry of claim 7, wherein the bank of input buffers is configured to receive SSTL-based signals.

12. The interface circuitry of claim 7, wherein the bank of input buffers is configured to receive GTL-based signals.

13. The interface circuitry of claim 7 including a plurality of low pass filters corresponding to the plurality of demultiplexers and to the plurality of input pads, each low pass filter being operable to inhibit noise from the corresponding input pad from coupling through the corresponding demultiplexer to the voltage rails.

14. Interface circuit for a programmable logic device, comprising:
   a plurality of voltage rails;
   an input/output pad connected to a pad line;
   an input buffer having a first input coupled to the pad line and a second input for a reference voltage;
   a demultiplexer configurable to connect the pad line to any one of the plurality of voltage rails; and
   a low pass filter coupled between the input/output pad and the demultiplexer and operable to inhibit noise from the pad from coupling through the demultiplexer to the voltage rails.

15. The interface circuitry of claim 14 wherein the low pass filter comprises a one-pole low pass filter.

16. Interface circuitry for a programmable logic device, comprising:
   a plurality of voltage rails;
   an input/output pad connected to a pad line;
   an input buffer having a first input coupled to the pad line and a second input for a reference voltage;
   a multiplexer configurable to connect any one of the plurality of voltage rails to the reference voltage input;
   a demultiplexer configurable to connect the pad line to any one of the plurality of voltage rails; and
   a low pass filter coupled between the input/output pad and the demultiplexer and operable to inhibit noise from the pad from coupling through the demultiplexer to the voltage rails.

* * * * *

UNITED STATES PATENT AND TRADEMARK OFFICE
CERTIFICATE OF CORRECTION

PATENT NO. : 6,859,066 B1
DATED : February 22, 2005
INVENTOR(S) : Arifur Rahman et al.

It is certified that error appears in the above-identified patent and that said Letters Patent is hereby corrected as shown below:

Column 5,
Line 37, "ass transistors" should be -- pass transistors --.

Signed and Sealed this

Seventh Day of June, 2005

JON W. DUDAS
*Director of the United States Patent and Trademark Office*